United States Patent
Zeng

(10) Patent No.: US 11,832,476 B2
(45) Date of Patent: Nov. 28, 2023

(54) DISPLAY PANEL AND DISPLAY DEVICE INCLUDING MULTI-THICKNESS SUB-REGIONS OF A LIGHT TRANSMITTING LAYER

(71) Applicant: Hubei Yangtze Industrial Innovation Center Of Advanced Display Co., Ltd., Wuhan (CN)

(72) Inventor: Yang Zeng, Wuhan (CN)

(73) Assignee: Hubei Yangtze Industrial Innovation Center Of Advanced Display Co., Ltd., Wuhan (CN)

(*) Notice: Subject to any disclaimer, the term of this patent is extended or adjusted under 35 U.S.C. 154(b) by 260 days.

(21) Appl. No.: 17/333,495

(22) Filed: May 28, 2021

(65) Prior Publication Data

US 2021/0288292 A1    Sep. 16, 2021

(30) Foreign Application Priority Data

Dec. 22, 2020 (CN) .......................... 202011533762.X

(51) Int. Cl.
*H10K 50/844* (2023.01)
*H10K 59/40* (2023.01)
(Continued)

(52) U.S. Cl.
CPC ......... *H10K 50/858* (2023.02); *G06F 3/0412* (2013.01); *H10K 50/844* (2023.02);
(Continued)

(58) Field of Classification Search
CPC .. H10K 50/858; H10K 50/844; H10K 50/865; H10K 50/86; H10K 59/40;
(Continued)

(56) References Cited

U.S. PATENT DOCUMENTS

| 10,916,592 B2* | 2/2021 | Lee ........................ H10K 59/40 |
| 2011/0081520 A1* | 4/2011 | Nojiri .................... G06F 3/0412 |
| | | 428/141 |

(Continued)

FOREIGN PATENT DOCUMENTS

| CN | 107850709 A | 3/2018 |
| CN | 110192129 A | 8/2019 |
| CN | 110797385 A | 2/2020 |

OTHER PUBLICATIONS

State Intellectual Property Office of the People's Republic of China, First Office Action, Chinese Application No. 202011533762.X, dated Apr. 20, 2022, 10 pages.

*Primary Examiner* — Ida M Soward
(74) *Attorney, Agent, or Firm* — CHRISTENSEN O'CONNOR JOHNSON KINDNESS PLLC

(57) ABSTRACT

A display panel includes at least one light transmitting layer, which includes at least one first sub-region and at least one second sub-region. A thickness of the first sub-region is different from a thickness of the second sub-region; the first sub-region includes a first surface proximate to a display surface of the display panel and a second surface facing away from the display surface of the display panel, and the second sub-region includes a third surface proximate to the display surface of the display panel and a fourth surface facing away from the display surface of the display panel; and for visible light, a phase difference between light reflected by the first surface and light reflected by the second surface is $\Delta 1$, and a phase difference between light reflected by the third surface and light reflected by the fourth surface is $\Delta 2$, where $0.5\pi \leq |\Delta 1 - \Delta 2| \leq 1.5\pi$.

20 Claims, 9 Drawing Sheets

(51) Int. Cl.
*H10K 50/858* (2023.01)
*G06F 3/041* (2006.01)
*H10K 50/86* (2023.01)
*H10K 59/12* (2023.01)
*H10K 59/121* (2023.01)
*H10K 59/124* (2023.01)
*H10K 102/00* (2023.01)
*G06F 3/042* (2006.01)
*G06F 3/044* (2006.01)

(52) U.S. Cl.
CPC ........... *H10K 50/865* (2023.02); *H10K 59/40* (2023.02); *G06F 3/0421* (2013.01); *G06F 3/0443* (2019.05); *H10K 50/86* (2023.02); *H10K 59/12* (2023.02); *H10K 59/121* (2023.02); *H10K 59/124* (2023.02); *H10K 2102/351* (2023.02)

(58) Field of Classification Search
CPC .... H10K 59/12; H10K 59/124; H10K 59/121; H10K 2102/351; G06F 3/0412; G06F 3/0443; G06F 3/0421
See application file for complete search history.

(56) References Cited

U.S. PATENT DOCUMENTS

| | | | |
|---|---|---|---|
| 2016/0104863 A1* | 4/2016 | Park | H10K 50/8426 438/28 |
| 2017/0373282 A1* | 12/2017 | Kim | H10K 50/865 |
| 2018/0120997 A1* | 5/2018 | Moon | H10K 59/1213 |
| 2018/0130974 A1* | 5/2018 | Koo | G02F 1/133308 |
| 2018/0321708 A1* | 11/2018 | Wu | G06F 3/0443 |
| 2018/0321764 A1* | 11/2018 | Oh | H10K 50/844 |
| 2019/0018530 A1* | 1/2019 | Lee | H10K 50/8445 |
| 2019/0067644 A1* | 2/2019 | Choi | H10K 50/854 |
| 2019/0129510 A1* | 5/2019 | Wang | G06F 3/042 |
| 2020/0057520 A1* | 2/2020 | Hung | G06F 3/044 |
| 2020/0097125 A1* | 3/2020 | Mutlu | G06F 3/0421 |
| 2020/0144550 A1* | 5/2020 | Lee | G06F 3/0412 |
| 2020/0243802 A1* | 7/2020 | Ju | H10K 50/86 |
| 2021/0126221 A1* | 4/2021 | Ye | H10K 50/858 |
| 2021/0167144 A1* | 6/2021 | Lim | H10K 50/865 |
| 2022/0102440 A1* | 3/2022 | Zeng | H10K 59/40 |
| 2023/0096606 A1* | 3/2023 | Yang | H10K 59/12 257/40 |

* cited by examiner

DISPLAY PANEL AND DISPLAY DEVICE INCLUDING MULTI-THICKNESS SUB-REGIONS OF A LIGHT TRANSMITTING LAYER

CROSS-REFERENCE TO RELATED APPLICATIONS

The present disclosure claims priority to Chinese Patent Application No. 202011533762.X, filed on Dec. 22, 2020, the content of which is incorporated herein by reference in its entirety.

TECHNICAL FIELD

The present disclosure relates to the field of display technology, and in particular, to a display panel and a display device.

BACKGROUND

A display panel has a stacked multilayer structure. The multilayer structure of the display panel has a certain reflection performance to ambient light. Currently, it is generally required that the reflection hue of the display panel to ambient light is neutral. In addition, the reflection hues of the display panels in different batches should not have an obvious difference, otherwise the final modules in the different batches will be inconsistent in appearance and color. As a result, a visual effect thereof will be quite poor, or even more, these modules may not be used as mass-produced products.

SUMMARY

A display panel and a display device are provided according to embodiments of the present disclosure, aiming to solve the problem of a large hue difference between different samples caused by thickness deviation of the film layer in a manufacturing process.

In a first aspect, a display panel is provided, and the display panel includes at least one light transmitting layer including at least one first sub-region and at least one second sub-region. A thickness of the at least one first sub-region is different from a thickness of the at least one second sub-region. Each of the at least one first sub-region includes a first surface close to a display surface of the display panel and a second surface facing away from the display surface of the display panel, and each of the at least one second sub-region includes a third surface close to the display surface of the panel and a fourth surface facing away from the display surface of the display panel. For visible light having a wavelength $\lambda_0$ directed to the display panel, a phase difference between light reflected by the first surface and light reflected by the second surface is $\Delta 1$, and a phase difference between light reflected by the third surface and light reflected by the fourth surface is $\Delta 2$, where $0.5\pi \le |\Delta 1 - \Delta 2| \le 1.5\pi$.

In a second aspect, a display device is provided according to an embodiment of the present disclosure. The display device includes the display panel described above.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, and other drawings can also be acquired by those skilled in the art.

DESCRIPTION OF EMBODIMENTS

In order to make the purpose, technical solutions, and advantages of the embodiments of the present disclosure be understandable, the technical solutions in the embodiments of the present disclosure are described clearly and completely in the following with reference to the accompanying drawings. It should be understood that the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

In a display panel, the respective thicknesses of most layers are on the order of sub-wavelength. A strong film interference effect may occur when ambient light irradiates the display panel. When irradiating the film, the light wave is reflected respectively at an upper interface and at a lower interface of the film due to the difference in refractive index, and the light waves reflected by the upper interface and reflected by the lower interface will interfere with each other to form a new light wave. This phenomenon is called film interference. However, it is difficult to completely eliminate the thickness deviation of the film layers in the process of manufacturing the display panel. For example, 10% thickness deviation of the film layer is sufficient to cause a significant change in a peak position of the film interference. In other words, due to the thickness inconformity of the film, the interference effect of the film is different at different positions, and thus different samples may have a quite large hue difference.

Accordingly, a display panel is provided according to an embodiment of the present disclosure. A light transmitting layer is provided in the display panel, through which light can transmit. The light transmitting layer includes at least two sub-regions with different thicknesses. The thicknesses of the two sub-regions can be controlled in such a manner that the hues of the two sub-regions change in opposite directions and counteract each other after the film interference of light having a certain wavelength in the two sub-regions. In this way, when the light transmitting layer has a thickness difference, the overall hue can maintain neutral, thereby alleviating or eliminating the hue difference.

Figure 1:
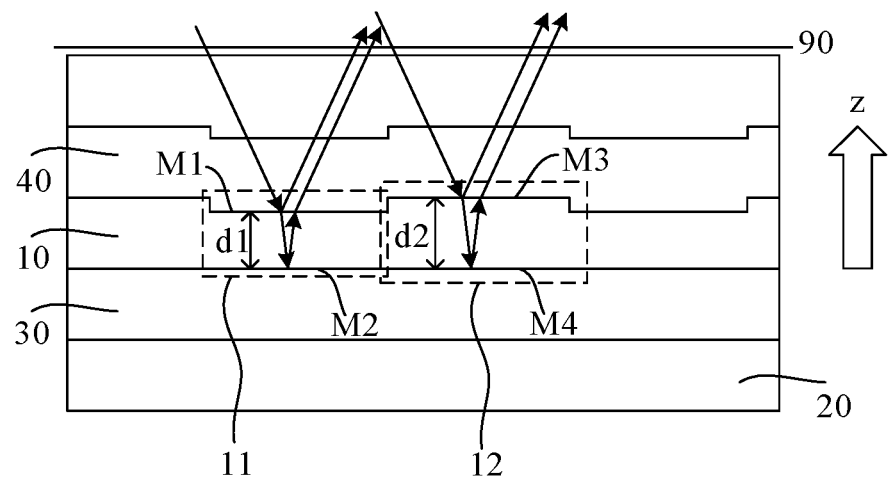
FIG. 1 is a simplified schematic diagram of a display panel according to an embodiment of the present disclosure.

FIG. 1 is a simplified schematic diagram of a display panel according to an embodiment of the present disclosure. A part of film layers in the structure of the display panel is illustrated in FIG. 1 in a simplified way. The display panel includes a light transmitting layer 10, which has a certain degree of light transmittance performance. In this embodiment of the present disclosure, the light transmitting layer 10 has a light transmittance ratio greater than 70%, and the light transmitting layer 10 is made of a material including any one of metal oxide, silicon nitride, or silicon oxide. In an embodiment, the light transmitting layer is made of a material including indium gallium zinc oxide, and the light transmitting layer has a light transmittance ratio greater than 80%. In an embodiment, the light transmitting layer is made of a material including silicon nitride, and the light transmitting layer has a light transmittance ratio greater than 90%. As shown in FIG. 1, the display panel includes a substrate 20, a first functional layer 30 adjacent to a lower interface of the light transmitting layer 10, and a second functional layer 40 adjacent to an upper interface of the light transmitting layer 10. As shown in FIG. 1, the first functional layer 30, the light transmitting layer 10 and the second functional layer 40 are stacked in sequence, one surface of the light transmitting layer 10 is in contact with the first functional layer 30, and another surface of the light transmitting layer 10 is in contact with the second functional layer 40.

The light transmitting layer 10 includes a first sub-region 11 and a second sub-region 12, which have different thicknesses. The thickness of the first sub-region 11 is d1, and the thickness of the second sub-region 12 is d2. In an example, d1 is smaller than d2, as shown in FIG. 1. The first sub-region 11 includes a first surface M1 proximate to a display surface 90 of the display panel, and a second surface M2 facing away from the display surface 90 of the display panel. The second sub-region 12 includes a third surface M3 proximate to the display surface 90 of the display panel, and a fourth surface M4 facing away from the display surface 90 of the display panel. The display surface 90 of the display panel is a surface that faces toward the user during usage. FIG. 1 also illustrates a light output direction z of the display panel. In the direction z, the first surface M1 is a surface of the first sub-region 11 of the light transmitting layer 10 facing away from the substrate 20, and the second surface M2 is a surface of the first sub-region 11 of the light transmitting layer 10 proximate to the substrate 20. Correspondingly, the third surface M3 is a surface of the second sub-region 12 of the light transmitting layer 10 faces away from the substrate 20, and the fourth surface M4 is a surface of the second sub-region 12 of the light transmitting layer 10 proximate to the substrate 20.

For visible light with a wavelength $\lambda_0$ directed to the display panel, as shown in FIG. 1, visible light will be reflected respectively at the first surface M1 and the second surface M2 of the first sub-region 11. A phase difference of the light reflected by the first surface M1 and the light reflected by the second surface M2 is $\Delta 1$. Visible light will be reflected respectively at the third surface M3 and the fourth surface M4 of the second sub-region 12. A phase difference of the light reflected by the third surface M3 and the light reflected by the fourth surface M4 is $\Delta 2$, where $0.5\pi \leq |\Delta 1 - \Delta 2| \leq 1.5\pi$.

When visible light with a wavelength of $\lambda_0$ irradiates the display panel, the light reflected by the first surface M1 of the first sub-region 11 and the light reflected by the second surface M2 of the first sub-region 11 have a phase difference of $\Delta 1$, and the light reflected by the third surface M3 of the second sub-region 12 and the light reflected by the fourth surface M4 of the second sub-region 12 have a phase difference of $\Delta 2$. In an embodiment of the present disclosure, the thickness of the first sub-region and the thickness of the second sub-region are designed such that $0.5\pi \leq |\Delta 1 - \Delta 2| \leq 1.5\pi$. That is, the phase of the light wave obtained by superimposing the light reflected by the first surface of the first sub-region of the light transmitting layer with the light reflected by the second surface of the first sub-region of the light transmitting layer is opposed to the phase of the light wave obtained by superimposing the light reflected by the third surface of the second sub-region of the light transmitting layer with the light reflected by the fourth surface of the second sub-region of the light transmitting layer. In this way, the hue of the light reflected by the first sub-region and the hue of the light reflected by the second sub-region counteract each other, thereby alleviating the hue nonuniformity caused by the thickness inconformity of the film in the process of manufacturing the light transmitting layer, so as to reduce the hue difference between different samples.

In an embodiment of the present disclosure, for example, the thickness d1 of the first sub-region 11 and the thickness d2 of the second sub-region 12 are designed such that when visible light having a wavelength of 550 nm irradiates the display panel, the following expression applies: $0.5\pi \leq |\Delta 1 - \Delta 2| \leq 1.5\pi$. This applies for $\lambda_0 = 550$ nm. In actual application scenarios, the display panel is exposed to outdoor ambient light for use, and a central wavelength of ambient light is generally 550 nm. In an embodiment of the present disclosure, the phase of the light wave obtained by superimposing light with the central wavelength of the ambient light that is reflected off the first surface of the first sub-region 11 of the light transmitting layer with that reflected off the second surface of the first sub-region 11 of the light transmitting layer is opposed to the phase of the light wave obtained by superimposing light having the central wavelength of the ambient light reflected off the third surface of the second sub-region 12 of the light transmitting layer with that reflected off the fourth surface of the second sub-region 12 of the light transmitting layer. In this way, hue of the light with the central wavelength of the ambient light reflected by the first sub-region and the hue of the light with the central wavelength of the ambient light reflected by the second sub-region counteract each other, thereby alleviating the hue inconformity of the light with the central wavelength of the ambient light reflected by the light transmitting layer.

In another embodiment, the thickness d1 of the first sub-region 11 and the thickness d2 of the second sub-region 12 are designed such that when visible light having a wavelength of 550 nm irradiates the display panel, the following expression applies: $|\Delta 1 - \Delta 2| = \pi$. That is, the phase of the light wave obtained by superimposing the light reflected by the first surface M1 of the light transmitting layer 10 with the light reflected by the second surface M2 of the light transmitting layer 10 in the first sub-region 11 is completely opposed to the phase of the light wave obtained by superimposing the light reflected by the third surface M3 of the light transmitting layer 10 with the light reflected by the fourth surface M4 of the light transmitting layer 10 in the second sub-region 12. In this way, the hue of the light reflected by the first sub-region 11 and the hue of the light reflected by the second sub-region 12 can counteract each other to the greatest extent, thereby effectively alleviating the hue inconformity caused by the thickness inconformity of the film in the process of manufacturing the light transmitting layer, so as to reduce the hue difference between different samples.

In an example, a refractive index of the light transmitting layer 10 is $n_0$. When visible light having a wavelength $\lambda_0$ irradiates the display panel in the first sub-region 11, the light reflected by the first surface M1 and the light reflected by the second surface M2 have an optical path difference S1. In the second sub-region 12, the light reflected by the third surface M3 and the light reflected by the fourth surface M4 have an optical path difference S2. Here, the optical path is equal to a product of a geometric path for propagating the light and the refractive index of the medium, and the optical path difference is a difference between the optical paths of the two beams of light. If an incident direction of the visible light is the same as a front view direction of the user when using the display panel, then $S1 = 2*d1*n_0$, and $S2 = 2*d2*n_0$.

According to the condition of interference counteraction, equation $|S1 - S2| = \lambda_0 * k / 2$ should be satisfied, where k is an odd number, such as 1, 3, 5, etc. That is, the optical path difference is equal to odd multiple of half-wavelength. Substituting S1 and S2 into the above formula, the following formula can be obtained: $|d1 - d2| * 2 * n_0 = \lambda_0 * k / 2$. Here, $n_0$ is related to the material of the light transmitting layer. When the material of the light transmitting layer is determined, $n_0$ can be determined. In a designing process of the light transmitting layer of the display panel, a relationship between the thicknesses of the first sub-region and the second sub-region is designed to satisfy the above formula. In this way, when the visible light with a wavelength of $\lambda_0$ irradiates the display panel, the hue of light reflected by the first sub-region and the hue of light reflected by the second sub-region counteract each other, thereby alleviating hue nonuniformity caused by the thickness nonuniformity of the film in the process of manufacturing the light transmitting layer, so as to reduce the hue difference between different samples when the user observes the display panel in the front view direction.

In an embodiment, when k=1, then $|d1 - d2| * 2 * n_0 = \lambda_0 / 2$. In this case, the hue of the light reflected by the first sub-region and the light reflected by the second sub-region can counteract each other, and a difference between the thickness of the first sub-region 12 and the thickness of the second sub-region 12 is the smallest, thereby having little effect on the overall flatness of the display panel.

In an embodiment of the present disclosure, the light transmitting layer 10 may include multiple first sub-regions 11 and multiple second sub-regions 12 dispersedly arranged. A total area of multiple first sub-regions 11 is A1, and a total area of multiple second sub-regions 12 is A2, where $0.1 \leq A1/A2 \leq 10$. In a specific embodiment, based on the refractive index of the material of the light transmitting layer and the value of the visible light wavelength $\lambda_0$, the thickness of the first sub-region and the thickness of the second sub-region, as well as the total area of the multiple first sub-regions and the total area of the multiple second sub-regions, are designed. Thus, the hue of the light reflected by the first sub-region and the hue of the light reflected by the second sub-region counteract each other, thereby alleviating the hue inconformity caused by the thickness inconformity of the film in the process of manufacturing the light transmitting layer.

In an embodiment, A1:A2=3:2.

In an embodiment, the display panel includes a light transmitting layer that meets the above-mentioned conditions.

Figure 2:
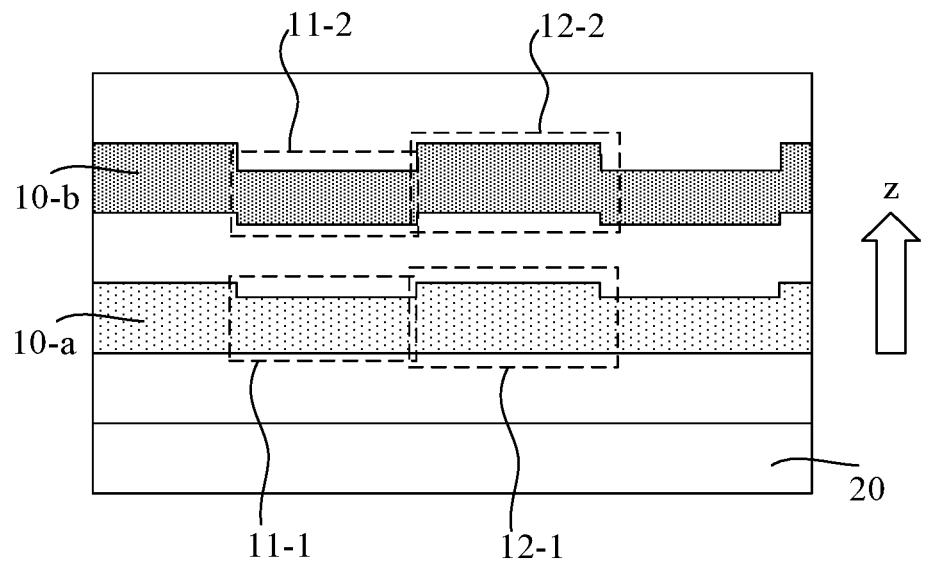
FIG. 2 is another simplified schematic diagram of a display panel according to an embodiment of the present disclosure.
Figure 12:
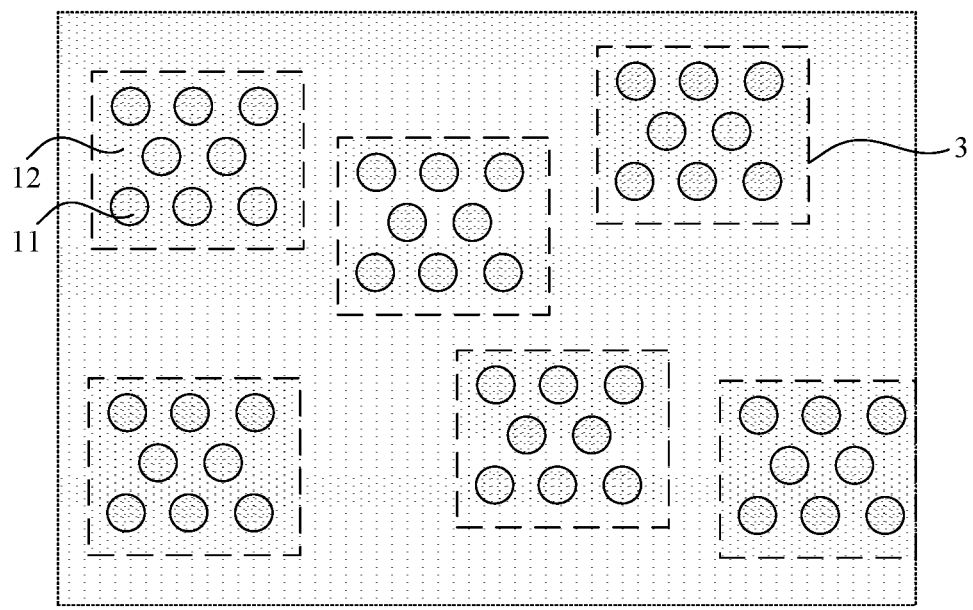
FIG. 12 is another partial schematic top view of a light transmitting layer according to an embodiment of the present disclosure.

In another embodiment, the display panel includes two or more light transmitting layers that meet the above-mentioned conditions. In this embodiment, multiple light transmitting layers may or may not be adjacent to each other. For example, FIG. 2 is another simplified schematic diagram of a display panel according to an embodiment of the present disclosure. As shown in FIG. 2, the display panel includes a substrate 20, and a first light transmitting layer 10-*a* and a second light transmitting layer 10-*b* which are disposed on the substrate 20. The first light transmitting layer 10-*a* includes a first sub-region 11-1 and a second sub-region 12-1 which have different thicknesses, and the second light transmitting layer 10-*b* includes a first sub-region 11-2 and a second sub-region 12-2 which have different thicknesses. An insulation layer (not labeled) is provided between the first light transmitting layer 10-*a* and the second light transmitting layer 10-*b*. Furthermore, as shown in FIG. 12, in a light output direction z of the display panel, an orthographic projection of the sub-region of the first light transmitting layer 10-*a* on the substrate 20 may at least partially overlap with an orthographic projection of the sub-region of the second light transmitting layer 10-*b* on the substrate 20, or the orthographic projection of the sub-region of the first light transmitting layer 10-*a* on the substrate 20 does not overlap with the orthographic projection of the sub-region of the second light transmitting layer 10-*b* on the substrate 20. In specific implementations, this can be designed according to specific design requirements.

Continuing to refer to FIG. 1, in the light output direction z of the display panel, the first functional layer 30, the light transmitting layer 10, and the second functional layer 40 are stacked in sequence. The light transmitting layer 10 covers at least part of the first functional layer 30, and the second functional layer 40 covers at least part of the light transmitting layer 10. That is, a surface of the light transmitting layer 10 is in contact with the first functional layer 30. For example, if the light transmitting layer 10 is a patterned film layer, the light transmitting layer 10 covers part of the first functional layer 30. Another surface of the light transmitting layer 10 is in contact with the second functional layer 40. For example, if the second functional layer 40 is a patterned film layer, the second functional layer 40 covers part of the light transmitting layer 10. In short, the first functional layer 30, the light transmitting layer 10, and the second functional layer 40 are stacked in sequence, at least a part of the light transmitting layer 10 has a surface in contact with the first functional layer 30, and another surface in contact with the second functional layer 40. If the refractive index of the light transmitting layer 10 is greatly different from the refractive index of the first functional layer 30 and the refractive index of the light transmitting layer 10 is greatly different from the refractive index of the second functional layer 40, an obvious film interference phenomenon may occur after light irradiates the light transmitting layer 10, and the hue inconformity caused by the thickness inconformity of the film in the process of manufacturing the light transmitting layer 10 is quite serious.

For example, in an embodiment of the present disclosure, the refractive index of the light transmitting layer 10 is $n_0$, the refractive index of the first functional layer 30 is $n_1$, and the refractive index of the second functional layer 40 is $n_2$, where $|n_0-n_1|\geq0.1$, and $|n_0-n_2|\geq0.1$. The light transmitting layer 10 includes at least the first sub-region 11 and the second sub-region 12 having different thicknesses, so that the hue of the light reflected by the first sub-region 11 and the hue of the light reflected by the second sub-region 12 counteract each other, thereby alleviating the hue inconformity caused by the thickness inconformity of the film in the process of manufacturing the light transmitting layer, so as to reduce the hue difference between different samples.

In an embodiment, the light transmitting layer 10 is manufactured by a halftone mask process, so as to form the first sub-region 11 and the second sub-region 12 which have different thicknesses.

In addition, the display panel includes multiple sub-pixels. The multiple sub-pixels are arranged in sub-pixel rows in a first direction, and arranged in sub-pixel columns in a second direction perpendicular to the first direction. In the first direction, a width of the first sub-region is within a range from 1 μm to 100 μm (including endpoint values); and in the second direction, a width of the first sub-region is within a range from 1 μm to 100 μm (including endpoint values). Moreover, in the first direction, a width of the second sub-region is within a range from 1 μm to 100 μm (including endpoint values), and in the second direction, a width of the second sub-region is within a range from 1 μm to 100 μm (including endpoint values). In an embodiment, the width of the first sub-region in the first direction is smaller than the width of the sub-pixel in the first direction, and the width of the first sub-region in the second direction is smaller than the width of the sub-pixel in the second direction. In addition, the width of the second sub-region in the first direction is smaller than the width of the sub-pixel in the first direction, and the width of the second sub-region in the second direction is smaller than the width of the sub-pixel in the second direction. A graphic area of the first sub-region and a graphic area of the second sub-region are both relatively small, thereby avoiding additional problems such as diffraction caused by patterning the light transmitting layer (patterning herein refers to a production of different regions having different thicknesses).

An arrangement of the first sub-region and the second sub-region of the light transmitting layer is described in the following embodiments.

Figure 3:
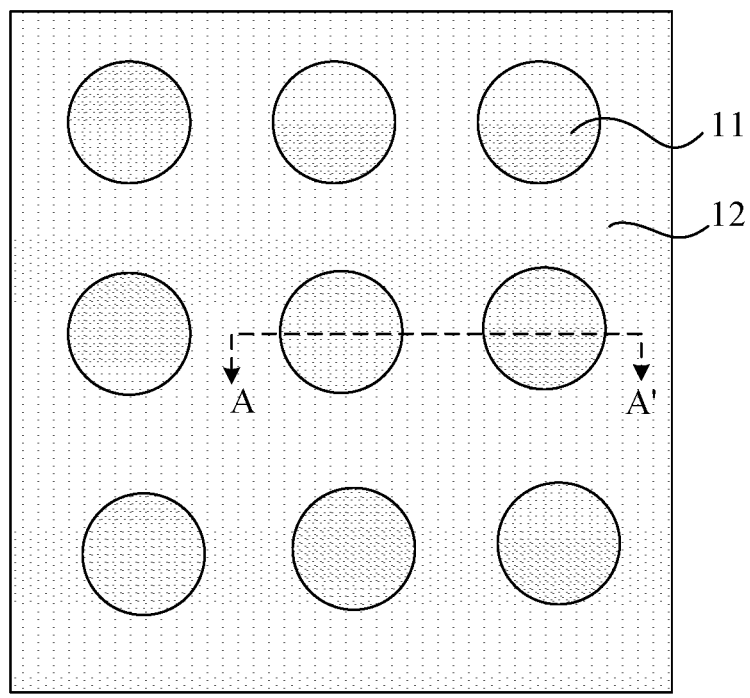
FIG. 3 is a partial schematic top view of a light transmitting layer of a display panel according to an embodiment of the present disclosure.
Figure 4:
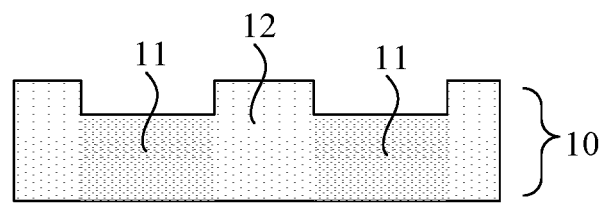
FIG. 4 is a schematic cross-sectional view of a section taken along A-A' shown in FIG. 3.
Figure 5:
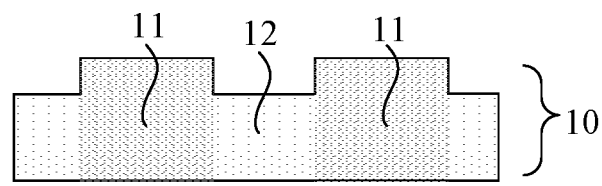
FIG. 5 is another schematic cross-sectional view of a section taken along A-A' shown in FIG. 3.

FIG. 3 is a partial schematic top view of a light transmitting layer of a display panel according to an embodiment of the present disclosure. FIG. 4 is a schematic cross-sectional view of a section taken along A-A' shown in FIG. 3. FIG. 5 is another schematic cross-sectional view of a section taken along A-A' shown in FIG. 3. As shown in FIG. 3, the light transmitting layer 10 includes multiple first sub-regions 11 regularly arranged, and a second sub-region 12 arranged between adjacent first sub-regions 11. In an embodiment of the present disclosure, a shape of each of the first sub-regions 11 regularly arranged may be different. The first sub-region 11 may be formed as a regular shape or an irregular shape. As shown in FIG. 3, the first sub-region 11 having a circular shape is taken as an example. Herein, the first sub-regions 11 regularly arranged can be illustrated as the first sub-regions 11 of the light transmitting layer have a same shape, and any adjacent first sub-regions 11 have the same distance.

In an embodiment, as shown in FIG. 4, the thickness of the first sub-region 11 is smaller than the thickness of the second sub-region 12, that is, the first sub-regions 11 having a smaller thickness are regularly arranged in the light transmitting layer 10.

In another embodiment, as shown in FIG. 5, the thickness of the first sub-region 11 is greater than the thickness of the second sub-region 12, that is, the first sub-regions 11 having a greater thickness are regularly arranged in the light transmitting layer 10.

Figure 6:
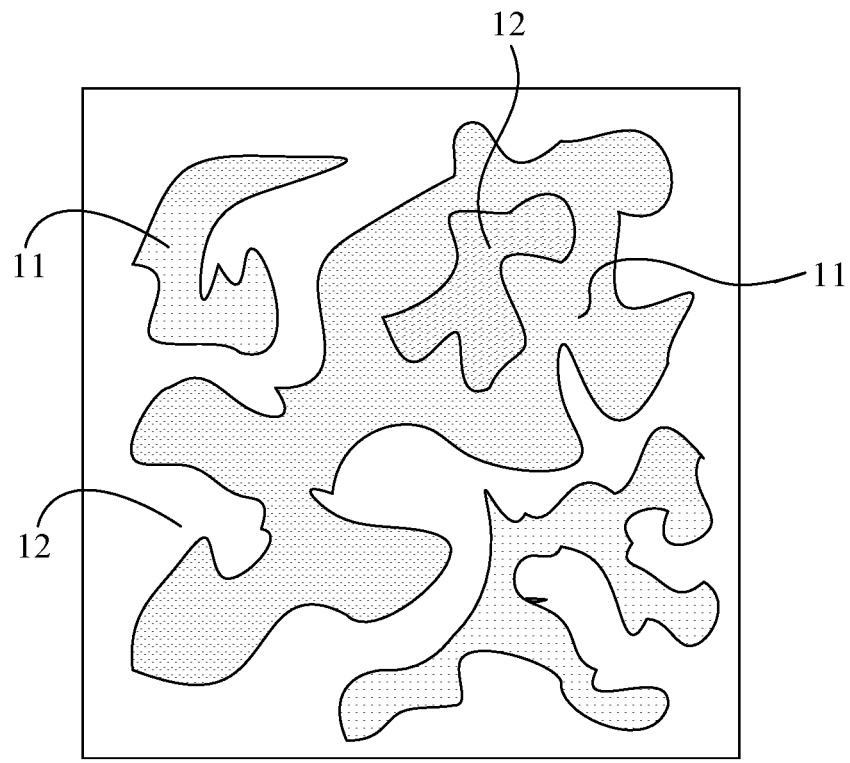
FIG. 6 is another partial schematic top view of a light transmitting layer of a display panel according to an embodiment of the present disclosure.

FIG. 6 is another partial schematic top view of a light transmitting layer of a display panel according to an embodiment of the present disclosure. In another embodiment, as shown in FIG. 6, the light transmitting layer includes multiple first sub-regions 11 randomly arranged, and a second sub-region 12 arranged between adjacent first sub-regions 11. Herein, the multiple first sub-regions 11 that are randomly arranged can be illustrated as the multiple first sub-regions 11 arranged irregularly and non-periodically. In this embodiment, the light transmitting layer includes the first sub-region and the second sub-region, which have different thicknesses, thereby alleviating the hue inconformity caused by the thickness inconformity of the film in the process of manufacturing the light transmitting layer. In addition, the multiple first sub-regions are randomly arranged, and correspondingly the second sub-regions are also randomly arranged, thereby avoiding a fixed-angle diffraction spot on the display panel caused by regular arrangement of the boundaries of the first sub-regions and the second sub-regions. The display panel is designed based on the technology of this embodiment in combination with the total area of the first sub-regions and the total area of the second sub-regions, so that the hue of the light reflected by the first sub-regions and the hue of the light reflected by the second sub-regions can counteract each other.

Figure 7:
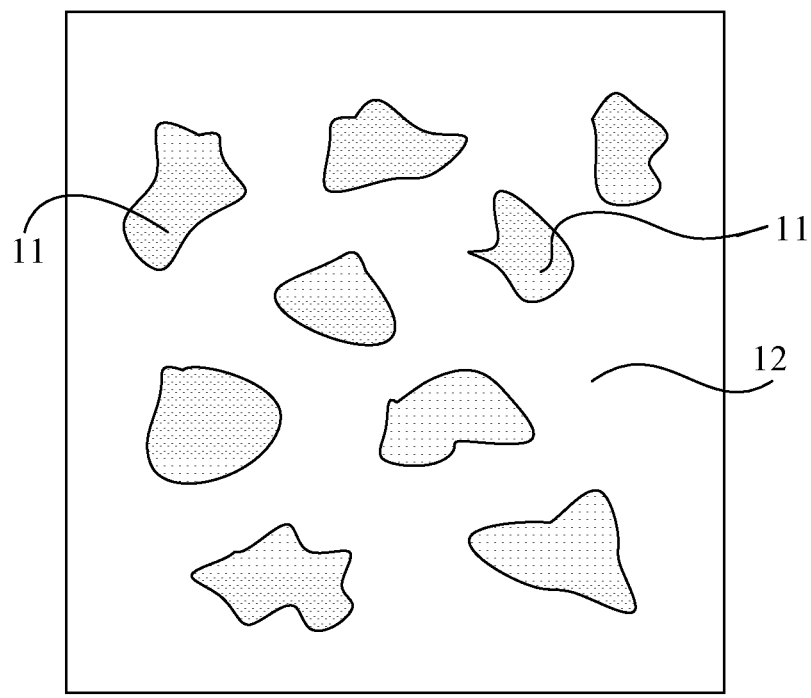
FIG. 7 is another partial schematic top view of a light transmitting layer of a display panel according to an embodiment of the present disclosure.

FIG. 7 is another partial schematic top view of a light transmitting layer of a display panel according to an embodiment of the present disclosure. In another embodiment, as shown in FIG. 7, the multiple first sub-regions 11 are randomly arranged, and a region between adjacent first sub-regions 11 is the second sub-region 12. In this embodiment, a shape and dimension of each of the first sub-regions 11 is arranged randomly.

In another embodiment, the multiple first sub-regions have the same shape, and are randomly arranged in the light transmitting layer, which is not shown herein.

In an embodiment of the present disclosure, a projection of the first sub-region on the substrate is referred to as a first projection, and an edge of the first projection is a curve, so as to avoid diffraction in a fixed-angle direction when the light irradiates the boundary between the first sub-region and the second sub-region.

In some embodiments, the light transmitting layer includes a first region and a second region. The first region includes at least one first sub-region and a second sub-region, and the second region includes at least one first sub-region and a second sub-region. The arrangement of the first sub-region and the second sub-region in the first region is different from the arrangement of the first sub-region and the second sub-region in the second region. The light transmitting layer includes the first region and the second region, and the arrangement of the sub-regions in the first region is different from the arrangement of the sub-regions in the second region, thereby increasing diversity of configurations of the light transmitting layer. Thus, the thickness of the light transmitting layer varies in different regions according to the specific structural characteristics of the light transmitting layer. This implementation can be applied to an embodiment where the light transmitting layer is an entire layer located in the display region, and can also be applied to an embodiment where the light transmitting layer itself is a patterned light transmitting layer.

Figure 8:
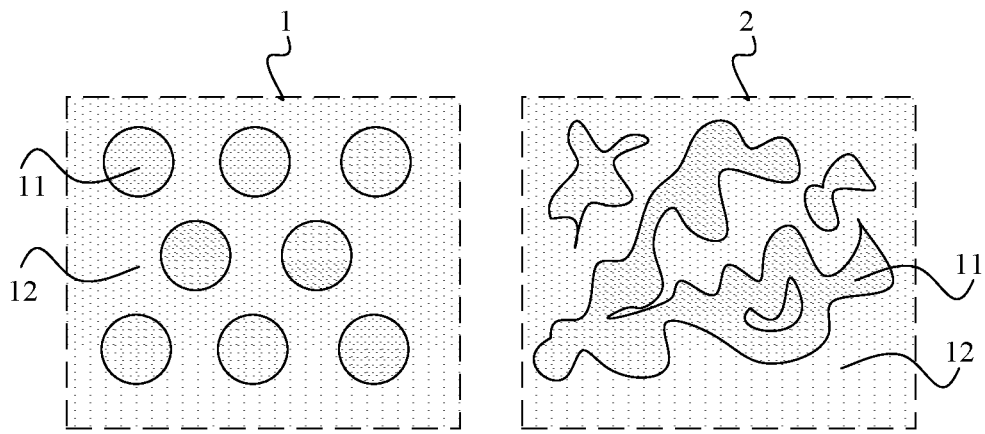
FIG. 8 is another partial schematic top view of a light transmitting layer according to an embodiment of the present disclosure.

FIG. 8 is another partial schematic top view of a light transmitting layer according to an embodiment of the present disclosure. In an embodiment, as shown in FIG. 8, the light transmitting layer includes a first region 1 and a second region 2. In the first region 1, multiple first sub-regions 11 are regularly arranged, and a region between adjacent first sub-regions 11 is the second sub-region 12. In the second region 2, multiple first sub-regions 11 and multiple second sub-regions 12 are randomly arranged. The light transmitting layer includes the first sub-region 11 and the second sub-region 12 which have different thicknesses, thereby alleviating the hue inconformity caused by the thickness inconformity of the film in the process of manufacturing the light transmitting layer, so as to reduce the hue difference between different samples. Then the arrangements of the first area 1 and the second area 2 in the light transmitting layer are designed to improve the hue of the light reflected by the entire display region, thereby reducing the hue difference between different samples.

Figure 9:
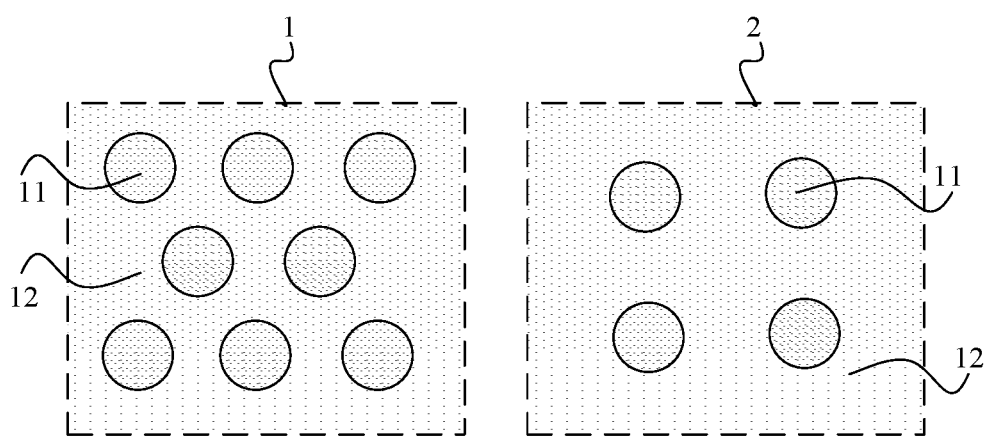
FIG. 9 is another partial schematic top view of a light transmitting layer according to an embodiment of the present disclosure.

FIG. 9 is another partial schematic top view of a light transmitting layer according to an embodiment of the present disclosure. In an embodiment, as shown in FIG. 9, in the first region 1, multiple first sub-regions 11 are regularly arranged, and a region between adjacent first sub-regions 11 is the second sub-region 12. In the second region 2, multiple first sub-regions 11 are regularly arranged, and a region between adjacent first sub-regions 11 is the second sub-region 12. In the embodiment of FIG. 9, the multiple first sub-regions 11 are regularly arranged in the first region 1, and the multiple first sub-regions 11 are regularly arranged in the second region 2, and t. The regular arrangement of the first sub-regions 11 in the first region 1 is different from the regular arrangement of the first sub-regions 11 in the second region 2. The thickness of the first sub-region 11 is designed to be different from the thickness of the second sub-region 12, so that the hue of the light reflected by the first sub-region 11 and the hue of the light reflected by the second sub-region 12 can counteract each other. The hue inconformity caused by the thickness inconformity of the film in the process of manufacturing the light transmitting layer can be alleviated by arranging the first region 1 and the second region 2, so as to maintain the neutral hue of the overall display panel and reduce the hue difference between different samples. In addition, the first sub-regions 11 in the first region 1 and the first sub-regions 11 in the second region 2 are regularly arranged. That is, the first sub-regions 11 are regularly arranged in the light transmitting layer, thereby simplifying the process of manufacturing the light transmitting layer to a certain extent.

In FIG. 9, the first sub-region 11 in the first region 1 has the same shape as the first sub-region 11 in the second region 2, but a distance between adjacent first sub-regions 11 in the first region 1 is different from a distance between adjacent first sub-regions 11 in the second region 2. Thus, the regular arrangement of the first sub-regions 11 in the first region 1 is different from the regular arrangement of the first sub-regions 11 in the second region 2. In another embodiment, the multiple first sub-regions 11 are regularly arranged in the first region 1 and the multiple first sub-regions 11 are regularly arranged in the second region 2; the first sub-regions 11 in the first region 1 have a different shape from the first sub-regions 11 in the second region 2; and a distance between adjacent first sub-regions 11 in the first region 1 is different from a distance between adjacent first sub-regions 11 in the second region 2, which is not shown herein.

Figure 10:
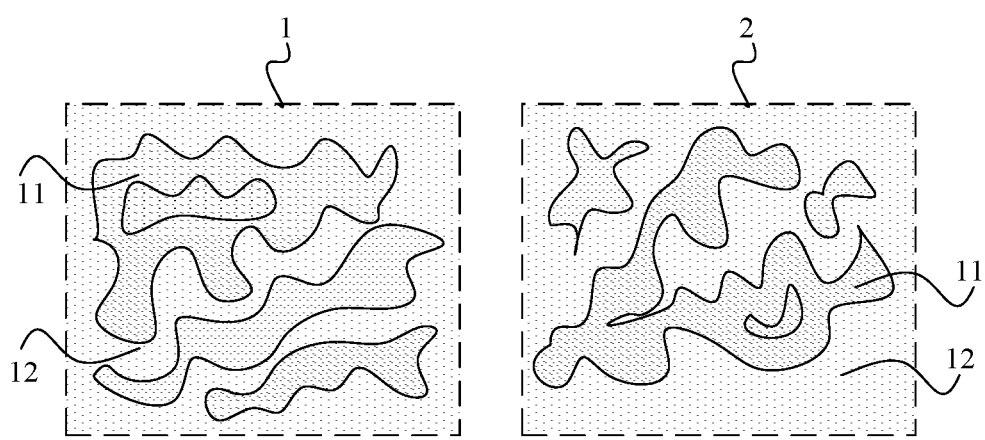
FIG. 10 is another partial schematic top view of a light transmitting layer according to an embodiment of the present disclosure.

FIG. 10 is another partial schematic top view of a light transmitting layer according to an embodiment of the present disclosure. In another embodiment, as shown in FIG. 10, in the first region 1, multiple first sub-regions 11 and multiple second sub-regions 12 are randomly arranged. In the second region 2, multiple first sub-regions 11 and multiple second sub-regions 12 are randomly arranged. Further, the arrangement of the first sub-regions 11 and the second sub-regions 12 in the first region 1 is different from the arrangement of the first sub-regions 11 and the second sub-regions 2 in the second region 2. By randomly arranging the first sub-regions 11 and the second sub-regions 12 in the first region 1 and the second region 2 respectively, the hue inconformity caused by the thickness inconformity of the film in the process of manufacturing the light transmitting layer can be alleviated, so as to reduce the hue difference between different samples. Meanwhile, the sub-regions of the light transmitting layer having different thicknesses are randomly arranged in the display region of the display panel, thereby avoiding a fixed-angle diffraction spot on the display panel caused by the regular arrangement of the boundaries of the first sub-regions and the second sub-regions.

Figure 11:
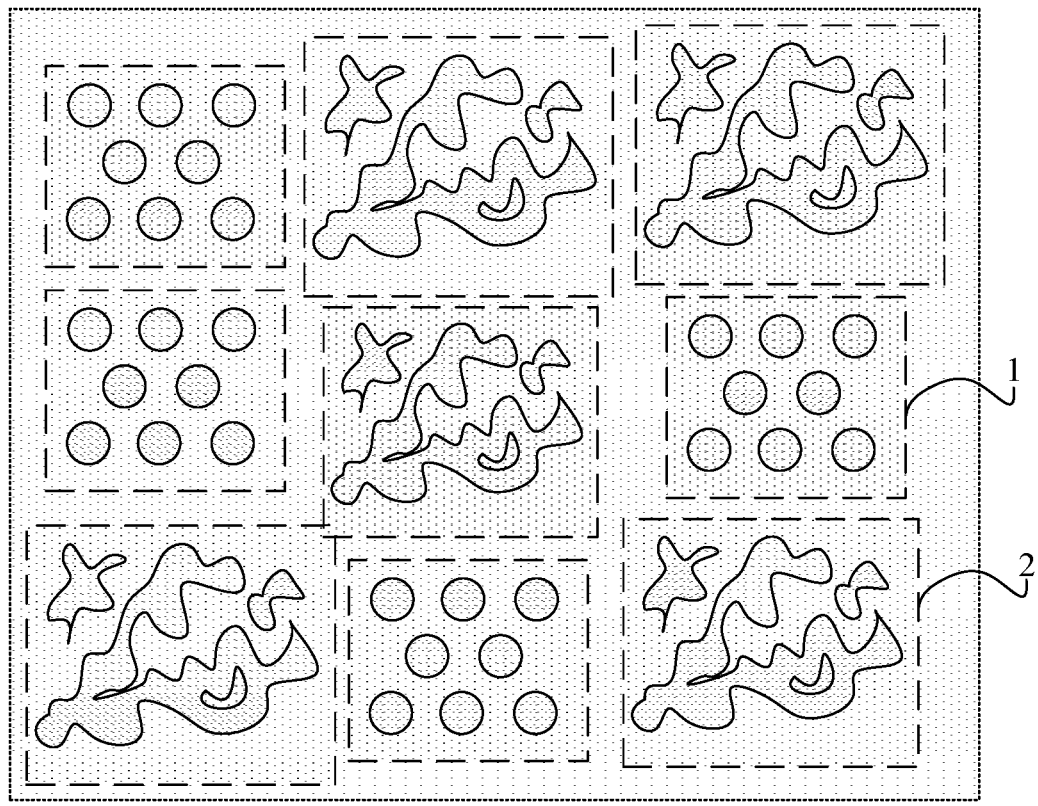
FIG. 11 is another partial schematic top view of a light transmitting layer according to an embodiment of the present disclosure.

FIG. 11 is another partial schematic top view of a light transmitting layer according to an embodiment of the present disclosure. In another embodiment, as shown in FIG. 11, in the display region of the display panel, the first regions 1 and the second regions 2 are randomly arranged. FIG. 11 schematically illustrates a case where the multiple first sub-regions 11 are regularly arranged in the first region 1, and the multiple first sub-regions 11 and the multiple second sub-regions 12 are randomly arranged in the second region 2. The structure in this embodiment can be combined with a specific structure of the light transmitting layer. The first region and the second region are randomly arranged in the display region. Thus, the thicknesses of the first sub-region and the second sub-region in each region are designed differently, so that the hue of the light reflected by the first sub-region and the hue of the light reflected by the second sub-region can counteract each other, thereby alleviating the hue inconformity caused by the thickness inconformity of the film in the process of manufacturing the light transmitting layer, so as to reduce the hue difference between different samples.

FIG. 12 is another partial schematic top view of a light transmitting layer according to an embodiment of the present disclosure. In an embodiment, as shown in FIG. 12, the light transmitting layer includes third regions 3, and each of the third regions 3 includes at least one first sub-region 11 and at least one second sub-region 12. In the display region of the display panel, the third regions 3 are randomly arranged. As shown in FIG. 12, in each of the third regions 3, the first sub-regions 11 are regularly arranged, and a region between any two adjacent first sub-regions 11 is the second sub-region 12. The first sub-region and the second sub-region having different thicknesses are provided in the third region, so that the hue of the light reflected by the first sub-region and the hue of the light reflected by the second sub-region can counteract each other, thereby alleviating the hue inconformity caused by the thickness inconformity of the film in the process of manufacturing the light transmitting layer. Moreover, the third regions are randomly arranged in the display region, thereby avoiding a fixed-angle diffraction spot on the display panel caused by regular arrangement of the boundaries of the first sub-regions and the second sub-regions.

The embodiments of FIG. 8 to FIG. 12 described above illustrate various configurations of the light transmitting area. In actual applications, the thickness of the light transmitting layer varies in different regions according to the specific structural characteristics of the light transmitting layer, thereby alleviating the hue inconformity caused by the thickness inconformity of the film in the process of manufacturing the light transmitting layer.

Figure 13:
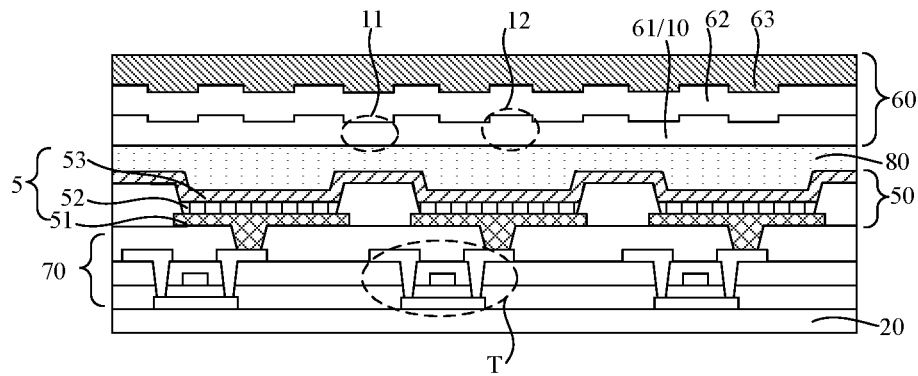
FIG. 13 is a schematic diagram of another film layer structure of a display panel according to an embodiment of the present disclosure.
Figure 14:
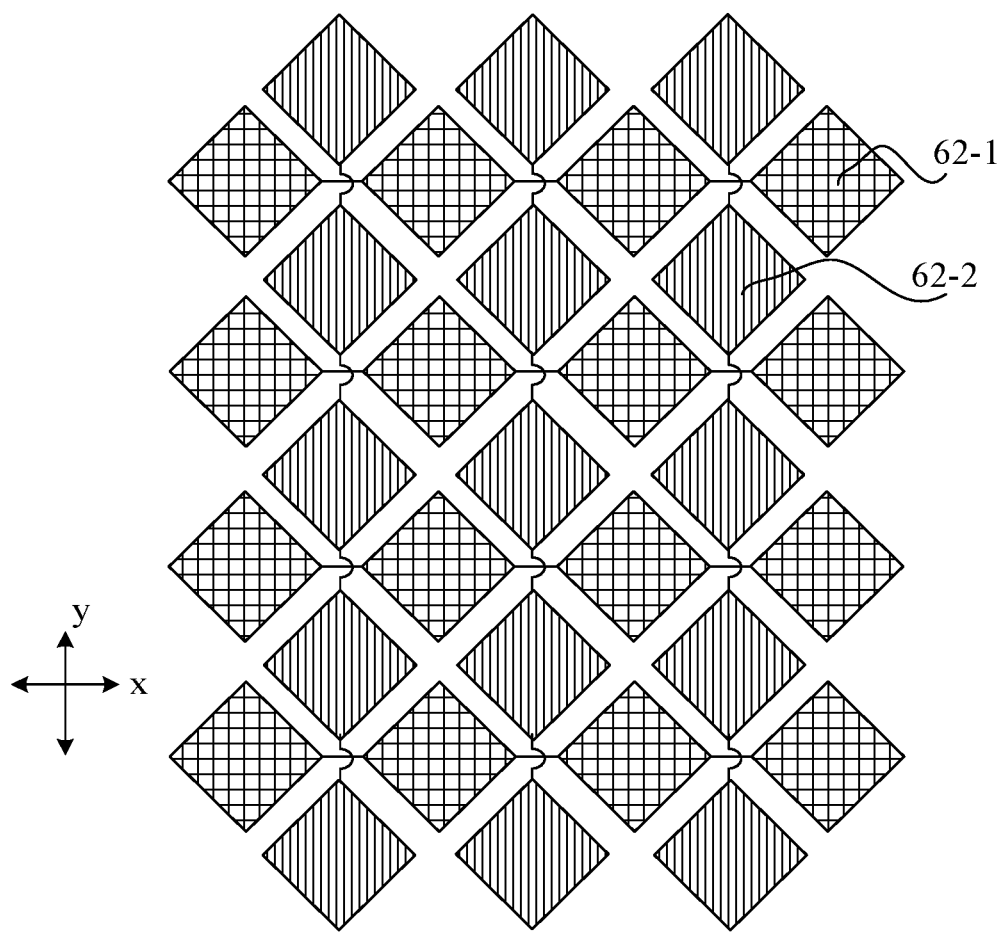
FIG. 14 is a schematic top view of a touch layer according to an embodiment of the present disclosure.

FIG. 13 is a schematic diagram of another film layer structure of a display panel according to an embodiment of the present disclosure. FIG. 14 is a schematic top view of a touch layer according to an embodiment of the present disclosure. In an embodiment, as shown in FIG. 13, the display panel includes a substrate 20, a display layer 50, and a touch layer 60. The touch layer 60 is located at a side of the display layer 50 facing away from the substrate 20. The touch layer 60 includes a touch insulation layer 61, a touch electrode layer 62 and a protective layer 63, which are stacked in sequence. Herein, the light transmitting layer 10 is reused as the touch insulation layer 61, and the touch electrode layer 62 is made of a material including indium gallium zinc oxide. As shown in FIG. 13, the touch insulation layer 61 includes a first sub-region 11 and a second sub-region 12 which have different thicknesses. A structure of the touch electrode layer 62 can be referred to FIG. 14. The touch electrode layer 62 includes multiple touch electrodes. The multiple touch electrodes include a first touch electrode 62-1 and a second touch electrode 62-2. As shown in FIG. 14, multiple first touch electrodes 62-1 arranged in a direction x are connected to each other, and multiple second touch electrodes 62-2 arranged in a direction y are connected to each other, where the direction x and the direction y are perpendicular to each other.

In the display panel, the material of the touch insulation layer is different from the material of the touch electrode layer, and the refractive index of a layer in the display panel has a certain relationship with the manufacturing process of the layer. The touch electrode layer 62 including indium gallium zinc oxide is made by an evaporation process. Conditions such as coating method, evaporation rate, and evaporation temperature will affect the refractive index of the touch electrode layer 62 after the final film is formed. In general, the refractive index of the film made from indium gallium zinc oxide is within a range from 1.8 to 2.1 (including endpoint values). The touch insulation layer is made of a material including silicon oxide or silicon nitride, and the refractive index of the touch insulation layer is related to the manufacturing material and film-forming process conditions thereof. In general, the refractive index of the touch insulation layer ranges from 1.5 to 2.0 (including endpoint values). Therefore, in the display panel, there is a certain difference between the refractive index of the touch insulation layer and the refractive index of the touch electrode layer. Thus, when visible light irradiates the touch insulation layer, strong film interference may occur. Moreover, in a display panel with a touch function, usually the touch function can be achieved within the entire display region, that is, the area of the touch electrode in the touch electrode layer 62 basically covers the entire display region. Thus, the thin film interference occurring on the interface between the touch electrode layer 62 and the touch insulation layer 61 will basically exist in the entire display region. In addition, the touch layer 60 is located at a side of the display layer 50 facing away from the substrate 20, that is, the touch layer 60 is located on the outside. Thus, the touch layer 60 is closer to the user's eyes during the usage of the display panel. Considering the above-mentioned factors, the problem of hue inconformity caused by the thickness inconformity of the film in the manufacturing process of the touch insulation layer 61 is more obvious.

In an embodiment of the present disclosure, the light transmitting layer is reused as the touch insulation layer, and the light transmitting layer is used as an insulation layer to insulate the touch electrode layer from other electron-conductive structure. The touch insulation layer includes the first sub-region and the second sub-region having different thicknesses. In this way, the hue of the light reflected by the first sub-region and the hue of the light reflected by the second sub-region can counteract each other, thereby effectively alleviating the hue inconformity caused by the thickness inconformity of the film in the process of manufacturing the touch insulation layer. The design of the film layer that causes greater hue inconformity in the display panel can be improved, and the hue difference between different samples can be effectively reduced.

In an embodiment, with further reference to FIG. 13, the display panel further includes an array layer 70, which is located between the substrate 20 and the display layer 50. The array layer 70 includes a pixel circuit. FIG. 13 illustrates a transistor T in the pixel circuit. The display layer 50 includes multiple light-emitting devices 5. Each of the multiple light-emitting devices 5 includes a first electrode 51, a light-emitting layer 52 and a second electrode 53 stacked in sequence. The first electrode 51 is connected to the drain (not labeled) of the transistor T. The display panel further includes an encapsulation structure 80 disposed on the display layer 50. The encapsulation structure 80 is configured to encapsulate and protect the light-emitting device 5, so as to improve a service life of the light-emitting device 5.

In an embodiment, after the array layer 70, the display layer 50 and the encapsulation structure 80 are sequentially formed on the substrate 20, the touch insulation layer 61, the touch electrode layer 62 and the protective layer 63 are sequentially formed on the encapsulation structure 80, so as to form the touch layer 60.

In another embodiment, a touch layer 60 including a touch insulation layer 61, a touch electrode layer 62 and a protective layer 63 is formed. After the array layer 70, the display layer 50 and the encapsulation structure 80 are sequentially formed on the substrate 20, the touch layer 60 adheres to the encapsulation structure 80 by using optical adhesive.

In addition, as shown in FIG. 13, the display layer 50 includes multiple light-emitting devices 5, that is, the display panel is an organic light-emitting display panel. In another embodiment, the display panel is a liquid crystal display panel, a display layer of the display panel includes liquid crystal molecules, and the display panel further includes an array layer and a color film layer. The liquid crystal molecules are provided between the array layer and the color film layer, which will not be illustrated herein with figures.

Figure 15:
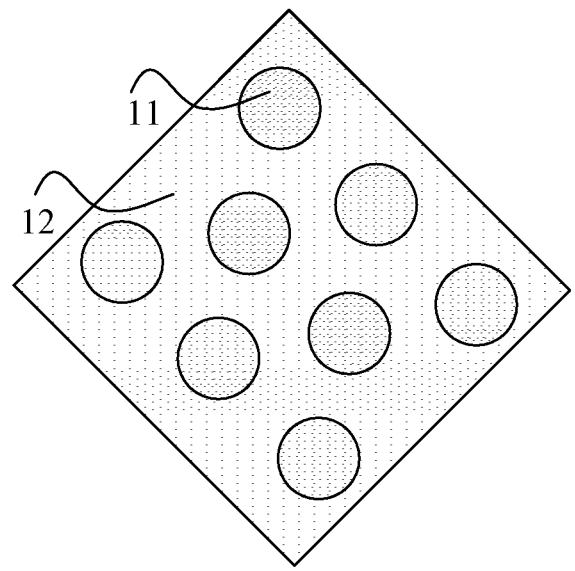
FIG. 15 is a schematic diagram of a touch electrode in a touch electrode layer of a display panel according to an embodiment of the present disclosure.

In another embodiment, the light transmitting layer is reused as a touch electrode layer. FIG. 15 is a schematic diagram of a touch electrode in a touch electrode layer of a display panel according to an embodiment of the present disclosure. As shown in FIG. 15, only one block-shaped touch electrode is shown for illustration, and the touch electrode includes a first sub-region 11 and a second sub-region 12. FIG. 15 schematically illustrates a case where the first sub-regions are regularly arranged in the block-shaped touch electrode, and a region between adjacent first sub-regions 11 is the second sub-region 12. In an embodiment, the first sub-region and the second sub-region may also be randomly arranged in the block-shaped touch electrode. The arrangement of the light transmitting layer described in the embodiments of FIG. 8 to FIG. 12 can be applied to the embodiment of FIG. 15. In addition, the arrangement of each sub-region in each touch electrode of the touch electrode layer may be the same or different.

In the display panel, the touch electrode in the touch electrode layer has a surface in contact with the protective layer, and another surface in contact with the touch insulation layer. The refractive index of the touch electrode is different from the refractive index of the protective layer, and the refractive index of the touch electrode is different from the refractive index of the touch insulation layer. When visible light irradiates the touch electrode, film interference occurs. Moreover, the area of the touch electrode in the touch electrode layer basically covers the entire display region, and the hue inconformity caused by the thickness inconformity of the film in the manufacturing process of the touch electrode (that is, the touch electrode layer) is quite observable. In an embodiment of the present disclosure, the touch electrode layer is a light transmitting layer, and the touch electrode includes the first sub-region and the second sub-region which have different thicknesses. In this way, the hue of the light reflected by the first sub-region and hue of the light reflected by the second sub-region counteract each other, thereby effectively alleviating the hue inconformity caused by the thickness inconformity of the film in the process of manufacturing the touch electrode layer. The design of the film layer that causes greater hue inconformity in the display panel can be improved, and the hue difference between different samples can be effectively reduced.

In another embodiment, the light transmitting layer is reused as a protective layer. That is, the protective layer on the touch electrode layer includes a first sub-region and a second sub-region which have different thicknesses, thereby alleviating the hue inconformity caused by the thickness inconformity of the film in the process of manufacturing the protective layer, which will not be further illustrated herein.

Figure 16:
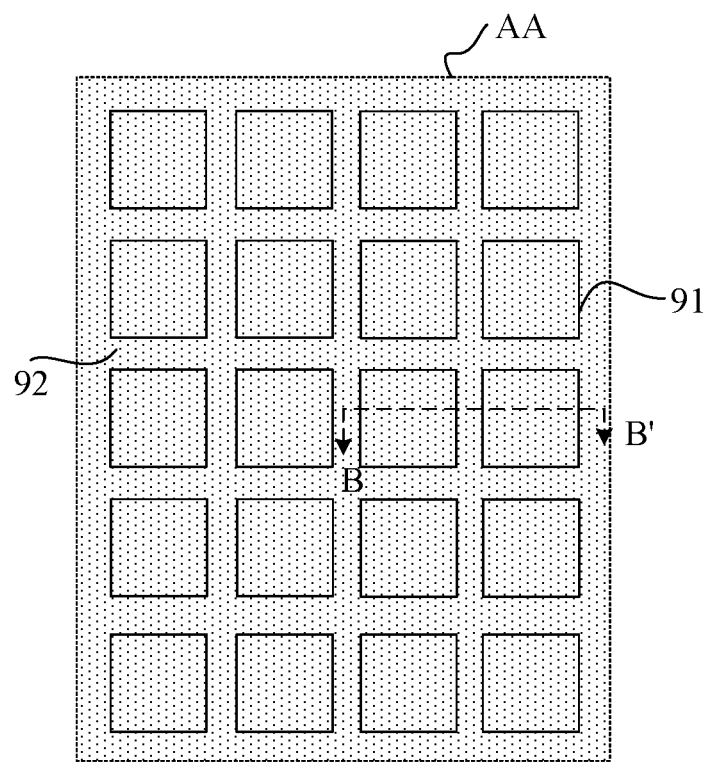
FIG. 16 is another partial schematic top view of a display panel according to an embodiment of the present disclosure.

FIG. 16 is another partial schematic top view of a display panel according to an embodiment of the present disclosure. In an embodiment, as shown in FIG. 16, the display region AA of the display panel includes a light-emitting area 91, and a non-light-emitting area 92 surrounding the light-emitting area 91. The shape of the light-emitting area 91 shown in FIG. 16 is merely schematic. Herein, each sub-pixel in the display region AA corresponds to a respective light-emitting area 91. In an embodiment where the display layer includes a light-emitting device, the light-emitting area 91 has the same shape as the light-emitting layer in the light-emitting device, and an orthographic projection of the light-emitting area 91 on the substrate substantially coincides with an orthographic projection of the light-emitting layer on the substrate. In an embodiment of the present disclosure, the first sub-region 11 (not labeled in FIG. 16) and the second sub-region 12 (not labeled in FIG. 16) of the light transmitting layer 10 are both located in the non-light-emitting area 92. In this embodiment, the first sub-region and the second sub-region which have different thicknesses, are arranged between adjacent light-emitting devices. Light emitted from the light-emitting area in the normal display region of the display panel does not pass through the first sub-region and the second sub-region having different thicknesses, thereby reducing an influence of the design of the light transmitting area on the display effect of the display panel.

In another embodiment, the display region of the display panel includes a light-emitting area and a non-light-emitting area surrounding the light-emitting area. The light transmitting layer is located at a side of the display layer facing away from the substrate. A part of first sub-region and a part of the second sub-region of the light transmitting layer are located in the light-emitting area, and the remaining part of the first sub-region and the remaining part of the second sub-region of the light transmitting layer are located in the non-light-emitting area. That is, the different areas of the light transmitting layer located at the larger area of the display region are designed to have different thicknesses. Thus, the hue inconformity caused by the thickness inconformity of the film in the process of the overall light transmitting layer is improved to effectively reduce the hue difference between samples.

Figure 17:
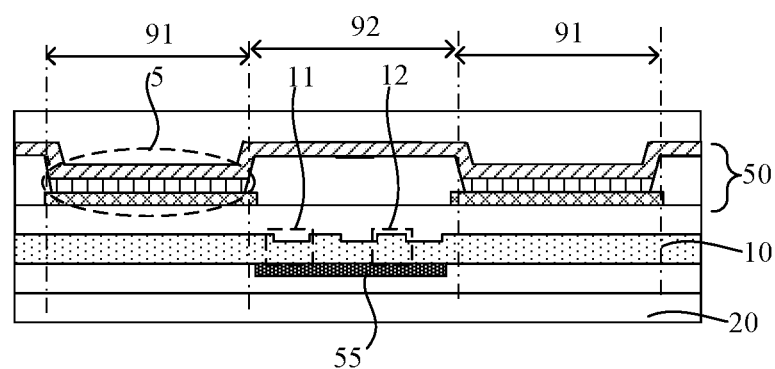
FIG. 17 is a schematic cross-sectional view of a section taken along B-B' shown in FIG. 16.

FIG. 17 is a schematic cross-sectional view of a section taken along B-B' shown in FIG. 16. Further, as shown in FIG. 17, the display panel includes a light absorption layer 55 located in the non-light-emitting area 92. The light absorption layer 55 is located at a side of the light transmitting layer 10 facing away from the display surface of the display panel. Herein, the first sub-region 11 and the second sub-region 12 cover the light absorption layer 55. That is, at least part of the surface of the light transmitting layer 10 proximate to the substrate 20 is in contact with the light absorption layer 55. In an embodiment, the light absorption layer is made of a metal material. The light absorption layer can absorb part of light emitted by the light transmitting layer into the light absorption layer, to reduce reflection of light on a contact interface between the light transmitting layer and the light absorption layer, so as to alleviate the film interference caused by the visible light irradiating the light transmitting layer.

Figure 18:
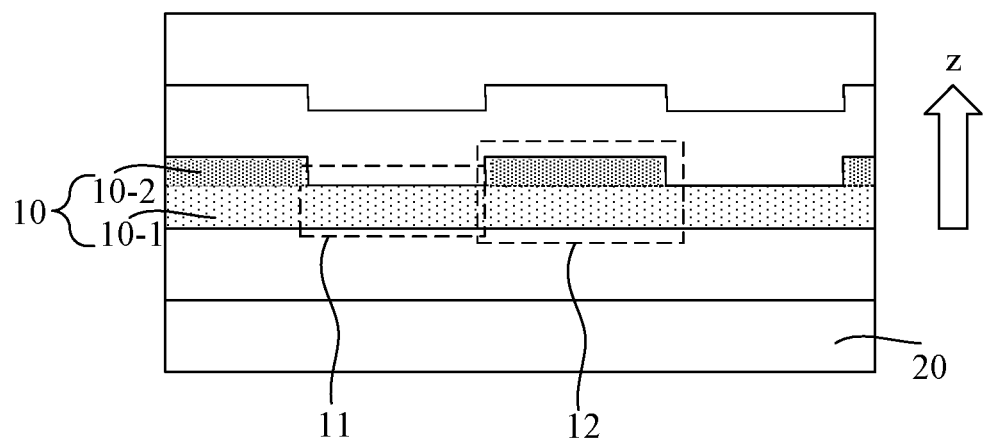
FIG. 18 is a simplified schematic diagram of another display panel according to an embodiment of the present disclosure.

FIG. 18 is a simplified schematic diagram of another display panel according to an embodiment of the present disclosure. In an embodiment, as shown in FIG. 18, the light transmitting layer 10 includes a first light transmitting sub-layer 10-1 and a patterned second light transmitting sub-layer 10-2 in the display region of the display panel.

Herein, the first sub-region 11 includes the first light transmitting sub-layer 10-1; and the second sub-region 12 includes the first light transmitting sub-layer 10-1 and the second light transmitting sub-layer 10-2 that are stacked. The first light transmitting sub-layer 10-1 and the second light transmitting sub-layer 10-2 are made of the same material. The light transmitting layer includes the first light transmitting sub-layer and the second light transmitting sub-layer that are stacked. During the manufacturing process, the first sub-region and the second sub-region which have different thicknesses are formed by controlling the film-forming thicknesses of the first light transmitting sub-layer and the second light transmitting sub-layer and patterning the second light transmitting sub-layer. In this embodiment, the thickness of the region with a smaller thickness in the light transmitting layer can be more accurately controlled, thereby avoiding a situation where the thickness of the region with the smaller thickness is too small to affect the application performance of the light transmitting layer.

Figure 19:
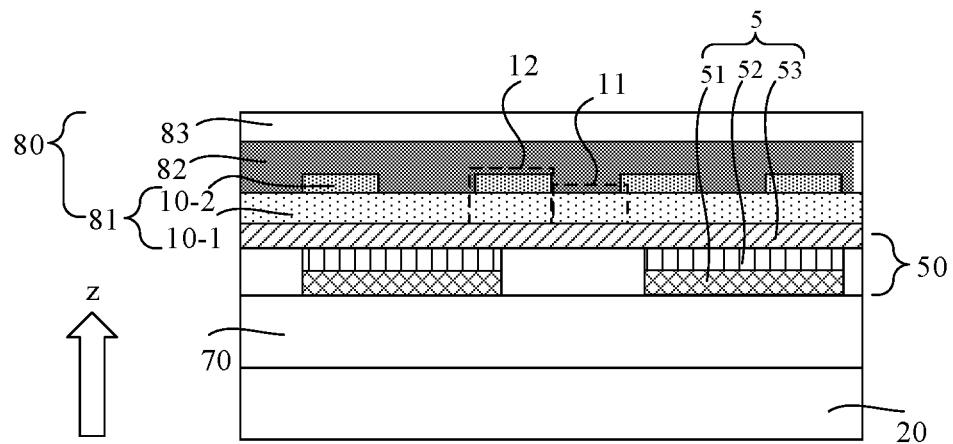
FIG. 19 is a schematic cross-sectional view of another display panel according to an embodiment of the present disclosure.

FIG. 19 is a schematic cross-sectional view of another display panel according to an embodiment of the present disclosure. In an embodiment, as shown in FIG. 19, the display panel includes a substrate 20, an array layer 70, a display layer 50, and an encapsulation structure 80 that are stacked. Herein, in the direction z along which light is emitted from the display panel, the encapsulation structure 80 includes a first inorganic encapsulation layer 81, an organic encapsulation layer 82, and a second inorganic encapsulation layer 83 that are stacked. The first inorganic encapsulation layer 81 is the light transmitting layer. The first inorganic encapsulation layer 81 includes a first light transmitting sub-layer 10-1 and a patterned second light transmitting sub-layer 10-2. The first inorganic encapsulation layer 81 includes a first sub-region 11 and a second sub-region 12. The first sub-region 11 includes the first light transmitting sub-layer 10-1, and the second sub-region 12 includes the first light transmitting sub-layer 10-1 and the second light transmitting sub-layer 10-2 that are stacked. As shown in FIG. 19, the display layer 50 includes a light-emitting device 5. The light-emitting device 5 includes a first electrode 51, a light-emitting layer 52, and a second electrode 53, which are stacked in sequence. The first electrode 51 is a reflective electrode, and the second electrode 53 is a semi-reflective and semi-transmissive electrode. That is, the second electrode 53 has a certain function of reflecting light and a certain function of transmitting light. The second electrode 53 is made of a material including magnesium and aluminum. The first inorganic encapsulation layer 81 covers the second electrode 53, and the first inorganic encapsulation layer 81 is made of a material including silicon oxide and/or silicon nitride. That is, a surface of the first inorganic encapsulation layer 81 proximate to the substrate 20 is in contact with the second electrode 53, and another surface of the first inorganic encapsulation layer 81 facing away from the substrate 20 is in contact with the organic encapsulation layer 82. The refractive index of the first inorganic encapsulation layer 81 is quite different from the refractive index of the second electrode 53, and the refractive index of the first inorganic encapsulation layer 81 is quite different from the refractive index of the organic encapsulation layer 82. Moreover, in order to encapsulate the light-emitting device 5 in the display layer 50, the first inorganic encapsulation layer 81 needs to be arranged as an entire surface. That is, the first inorganic encapsulation layer 81 is provided on the entire surface of the display region. Then, when visible light irradiates the first inorganic encapsulation layer 81, film interference occurs, and such film interference exists in the entire surface of the display region. Thus, the hue inconformity caused by the thickness inconformity of the film in the process of manufacturing the first inorganic encapsulation layer 81 is more obvious.

In an embodiment of the present disclosure, the first inorganic encapsulation layer includes the first sub-region and the second sub-region which have different thicknesses. In this way, the hue of the light reflected by the first sub-region and the hue of the light reflected by the second sub-region can counteract each other, thereby effectively alleviating the hue inconformity caused by the thickness inconformity of the film in the process of manufacturing the first inorganic encapsulation layer. The design of the film layer that causes greater hue fluctuations in the display panel can be improved, and the hue difference between different samples can be effectively reduced. Moreover, the first inorganic encapsulation layer includes the first light transmitting sub-layer and the second light transmitting sub-layer that are stacked. During the manufacturing process, the first sub-region and the second sub-region which have different thicknesses are formed by controlling the film-forming thicknesses of the first light transmitting sub-layer and the second light transmitting sub-layer, and patterning the second light transmitting sub-layer. In this embodiment, the thickness of the region with a smaller thickness in the first inorganic encapsulation layer can be more accurately controlled, thereby avoiding that the thickness of the region with a smaller thickness is too small to affect the encapsulation performance of the first inorganic encapsulation layer, and avoiding encapsulation failure.

In another embodiment, the second inorganic encapsulation layer is a light transmitting layer, and the second inorganic encapsulation layer includes a first light transmitting sub-layer and a patterned second light transmitting sub-layer that are stacked. The second inorganic encapsulation layer includes a first sub-region and a second sub-region which have different thicknesses. The first sub-region includes the first light transmitting sub-layer, and the second sub-region includes the first light transmitting sub-layer and the second light transmitting sub-layer that are stacked. In this embodiment, the hue inconformity caused by the thickness inconformity of the film in the process of manufacturing the second inorganic encapsulation layer can be alleviated. The thickness of the region with a smaller thickness in the second inorganic encapsulation layer can be more accurately controlled, thereby avoiding that the thickness of the region with a smaller thickness is too small to affect the encapsulation performance of the second inorganic encapsulation layer.

Figure 20:
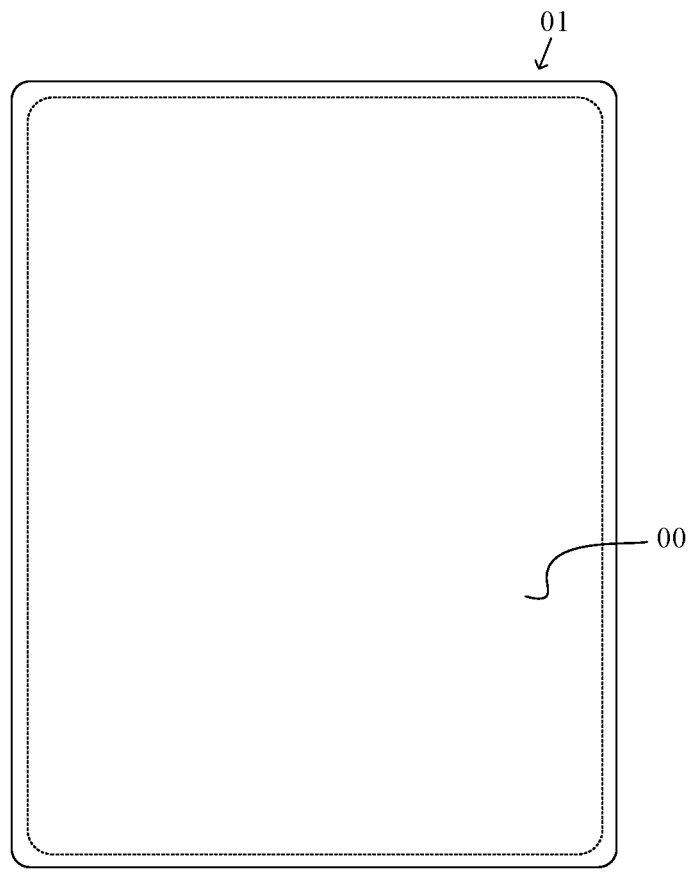
FIG. 20 is a schematic diagram of a display device according to an embodiment of the present disclosure.

A display device is further provided according to an embodiment of the present disclosure. FIG. 20 is a schematic diagram of a display device according to an embodiment of the present disclosure. As shown in FIG. 20, the display device 01 includes a display panel 00 provided by any embodiment of the present disclosure. The structure of the display panel has been described in the above embodiments, and will not be repeated herein. The display device 01 in this embodiment of the present disclosure may be any device with a display function, such as a mobile phone, a tablet computer, a notebook computer, an electronic book, a television, and a smart wearable product.

The above description is merely exemplary embodiments of the present disclosure, and is not intended to limit the scope of the present disclosure. All equivalent structures or equivalent process transformations, based on the specification and the drawings of the present disclosure, which may be directly or indirectly applied to other related technology fields are within the scope of the present disclosure.

Finally, it should be noted that, the above-described embodiments are merely for illustrating the present disclosure. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
    a substrate;
    a display layer;
    a first functional layer;
    a second functional layer; and
    a touch layer located at a side of the display layer facing away from the substrate,
    wherein the touch layer comprises at least one light transmitting layer, wherein each of the at least one light transmitting layer comprises at least one first sub-region and at least one second sub-region viewed in a light output direction of the display panel, wherein a thickness of the at least one first sub-region is different from a thickness of the at least one second sub-region;
    each of the at least one first sub-region comprises a first surface proximate to a display surface of the display panel and a second surface facing away from the display surface of the display panel, and each of the at least one second sub-region comprises a third surface proximate to the display surface of the display panel and a fourth surface facing away from the display surface of the display panel;
    wherein for visible light with a wavelength of $\lambda_0$ directed to the display panel, a phase difference between light reflected by the first surface and light reflected by the second surface is $\Delta 1$, a phase difference between light reflected by the third surface and light reflected by the fourth surface is $\Delta 2$, and wherein $0.5\pi \leq |\Delta 1 - \Delta 2| \leq 1.5\pi$,
    the first functional layer, the light transmitting layer, and the second functional layer are stacked in sequence in the light output direction of the display panel, the light transmitting layer covers at least part of the first functional layer and the second functional layer covers at least part of the light transmitting layer; and
    a refractive index of the light transmitting layer is $n_0$, a refractive index of the first functional layer is $n_1$, and a refractive index of the second functional layer is $n_2$, where $|n_0 - n_1| \geq 0.1$ and $|n_0 - n_2| \geq 0.1$.

2. The display panel according to claim 1, wherein $\lambda_0 = 550$ nm.

3. The display panel according to claim 1, wherein $|\Delta 1 - \Delta 2| = \pi$.

4. The display panel according to claim 1, wherein the thickness of the at least one first sub-region is d1, the thickness of the at least one second sub-region is d2, a refractive index of the light transmitting layer is $n_0$, and wherein $|d1 - d2|*2*n_0 = \lambda_0 * k/2$, where k is an odd number.

5. The display panel according to claim 4, wherein k=1.

6. The display panel according to claim 1, wherein a total area of the at least one first sub-region is A1, and a total area of the at least one second sub-region is A2, where $0.1 \leq A1/A2 \leq 10$.

7. The display panel according to claim 1, wherein the light transmitting layer comprises a plurality of first sub-regions that are regularly arranged, and the at least one second sub-region is arranged between adjacent first sub-regions of the plurality of first sub-regions.

8. The display panel according to claim 1, wherein the light transmitting layer comprises a plurality of first sub-regions that are randomly arranged, and the at least one second sub-region is arranged between adjacent first sub-regions of the plurality of first sub-regions.

9. The display panel according to claim 1, wherein the light transmitting layer comprises a first region and a second region, wherein the first region comprises at least one first sub-region and at least one second sub-region, and the second region comprises at least one first sub-region and at least one second sub-region; and
    wherein an arrangement of the at least one first sub-region and the at least one second sub-region in the first region is different from an arrangement of the at least one first sub-region and the at least one second sub-region in the second region.

10. The display panel according to claim 9, wherein
    the first region comprises a plurality of first sub-regions that are regularly arranged, and the at least one second sub-region is arranged between adjacent first sub-regions of the plurality of first sub-regions; and
    the second region comprises a plurality of first sub-regions that are randomly arranged, and a plurality of second sub-regions are randomly arranged; or the second region comprises a plurality of first sub-regions that are regularly arranged, and the at least one second sub-region is arranged between adjacent first sub-regions of the plurality of first sub-regions.

11. The display panel according to claim 9, wherein
    the first region comprises a plurality of first sub-regions that are randomly arranged, and a plurality of second sub-regions are randomly arranged; and
    the second region comprises a plurality of first sub-regions that are randomly arranged, and a plurality of second sub-regions are randomly arranged.

12. The display panel according to claim 9, wherein, in a display region of the display panel, the first region and the second region are randomly arranged.

13. The display panel according to claim 9, wherein the light transmitting layer further comprises a third region, the third region comprises at least one first sub-region and at least one second sub-region, and the third region is randomly arranged in a display region of the display panel.

14. The display panel according to claim 1, wherein the touch layer comprises a touch insulation layer, a touch electrode layer and a protective layer that are stacked in sequence; and at least one of the touch insulation layer, the touch electrode layer, and the protective layer is the light transmitting layer.

15. The display panel according to claim 14, wherein the light transmitting layer is reused as the touch insulation layer, and the touch electrode layer is made of a material comprising indium gallium zinc oxide.

16. The display panel according to claim 1, wherein a display region of the display panel comprises a light-emitting area and a non-light-emitting area surrounding the light-emitting area; and the at least one first sub-region and the at least one second sub-region are located in the non-light-emitting area.

17. The display panel according to claim 16, further comprising a light absorption layer located in the non-light-emitting area, wherein the light absorption layer is located at a side of the light transmitting layer facing away from the display surface of the display panel, and the at least one first sub-region and the at least one second sub-region cover the light absorption layer.

18. The display panel according to claim 1, wherein:
the light transmitting layer comprises a first light transmitting sub-layer and a patterned second light transmitting sub-layer that are located in a display region of the display panel; and
the at least one first sub-region comprises the first light transmitting sub-layer, and the at least one second sub-region comprises the first light transmitting sub-layer and the second light transmitting sub-layer that are stacked.

19. A display device, comprising a display panel, wherein:
the display panel comprises: a substrate, a display layer, a first functional layer, a second functional layer, and a touch layer located at a side of the display layer facing away from the substrate,
wherein the touch layer comprises at least one light transmitting layer, each of the at least one light transmitting layer comprises at least one first sub-region and at least one second sub-region viewed in a light output direction of the display panel, wherein a thickness of the at least one first sub-region is different from a thickness of the at least one second sub-region;
each of the at least one first sub-region comprises a first surface proximate to a display surface of the display panel and a second surface facing away from the display surface of the display panel, and each of the at least one second sub-region comprises a third surface proximate to the display surface of the display panel and a fourth surface facing away from the display surface of the display panel;
wherein for visible light with a wavelength of $\lambda_0$ directed to the display panel, a phase difference between light reflected by the first surface and light reflected by the second surface is $\Delta 1$, a phase difference between light reflected by the third surface and light reflected by the fourth surface is $\Delta 2$, and wherein $0.5\pi \leq |\Delta 1 - \Delta 2| \leq 1.5\pi$,
the first functional layer, the light transmitting layer, and the second functional layer are stacked in sequence in the light output direction of the display panel, the light transmitting layer covers at least part of the first functional layer and the second functional layer covers at least part of the light transmitting layer; and
a refractive index of the light transmitting layer is $n_0$, a refractive index of the first functional layer is $n_1$, and a refractive index of the second functional layer is $n_2$, where $|n_0 - n_1| \geq 0.1$ and $|n_0 - n_2| \geq 0.1$.

20. A display panel, comprising:
a substrate;
a display layer; and
a touch layer located at a side of the display layer facing away from the substrate,
wherein the touch layer comprises a touch insulation layer, a touch electrode layer and a protective layer that are stacked in sequence, wherein at least one of the touch insulation layer, the touch electrode layer, or the protective layer is a light transmitting layer, and wherein each light transmitting layer comprises at least one first sub-region and at least one second sub-region viewed in a light output direction of the display panel, wherein a thickness of the at least one first sub-region is different from a thickness of the at least one second sub-region;
each of the at least one first sub-region comprises a first surface proximate to a display surface of the display panel and a second surface facing away from the display surface of the display panel, and each of the at least one second sub-region comprises a third surface proximate to the display surface of the display panel and a fourth surface facing away from the display surface of the display panel; and
wherein for visible light with a wavelength of $\lambda_0$ directed to the display panel, a phase difference between light reflected by the first surface and light reflected by the second surface is $\Delta 1$, a phase difference between light reflected by the third surface and light reflected by the fourth surface is $\Delta 2$, and wherein $0.5\pi \leq |\Delta 1 - \Delta 2| \leq 1.5\pi$.

* * * * *